(12) United States Patent
Shau

(10) Patent No.: US 6,885,079 B2
(45) Date of Patent: Apr. 26, 2005

(54) METHODS AND CONFIGURATION TO SIMPLIFY CONNECTIONS BETWEEN POLYSILICON LAYER AND DIFFUSION AREA

(76) Inventor: Jeng-Jye Shau, 991 Amarillo Ave., Palo Alto, CA (US) 94303

( * ) Notice: Subject to any disclaimer, the term of this patent is extended or adjusted under 35 U.S.C. 154(b) by 0 days.

(21) Appl. No.: 10/685,623

(22) Filed: Oct. 14, 2003

(65) Prior Publication Data

US 2004/0080017 A1 Apr. 29, 2004

Related U.S. Application Data

(60) Provisional application No. 60/420,884, filed on Oct. 23, 2002.

(51) Int. Cl.[7] .............................................. H01L 29/00
(52) U.S. Cl. ........................ 257/503; 257/505; 257/144; 257/150; 257/459; 257/602; 438/22; 438/129; 438/98; 438/570
(58) Field of Search ............................. 257/4, 91, 144, 257/150, 208, 211, 457, 459, 503, 505, 509, 573, 602, 662, 663; 438/22, 128, 129, 48, 98, 570

(56) References Cited

U.S. PATENT DOCUMENTS 5,032,880 A * 7/1991 Tsunoda ...................... 257/141

* cited by examiner

Primary Examiner—Nathan J. Flynn
Assistant Examiner—Scott R. Wilson
(74) Attorney, Agent, or Firm—Bo-In Lin

(57) ABSTRACT

An electronic device supported on a semiconductor substrate. The semiconductor device includes a diffusion area in the substrate and a polysilicon layer extending over the substrate and contacting the diffusion area. The electronic device further includes a conductive contact covering and contacting both the polysilicon layer and the diffusion area. Therefore, the semiconductor device disclosed in this invention includes poly-to-diffusion connection for a semiconductor device that has a diffusion are and a polysilicon area. The semiconductor device further includes a contact that covers both the diffusion area and the polysilicon area with a contact filling material forming the connection between these two areas.

14 Claims, 4 Drawing Sheets cross section after metal 1

FIG. 2(a) top view
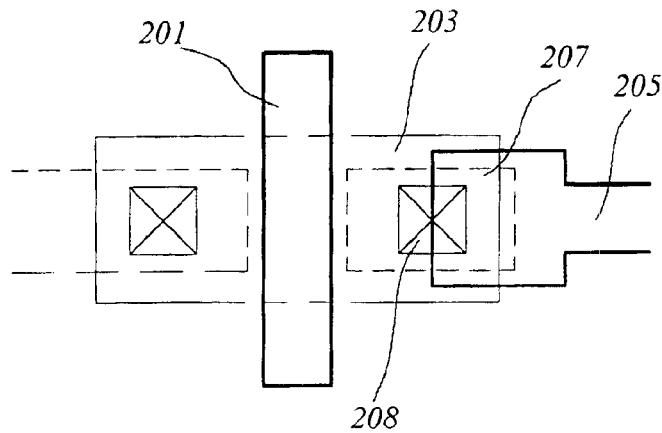
FIG. 2(b) cross section after contact etch
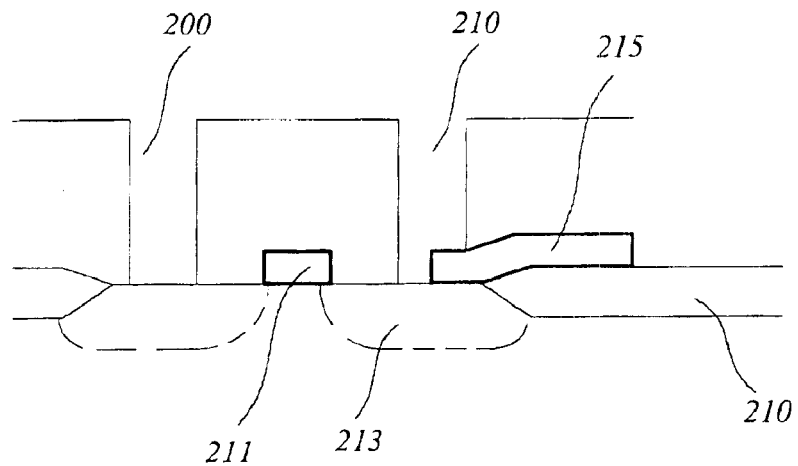
FIG. 2(c) cross section after metal 1
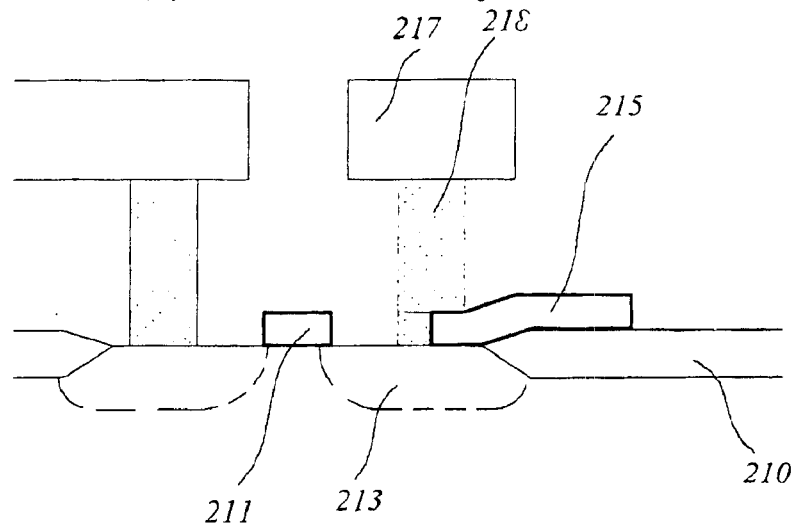

FIG. 2(d) no metal cap
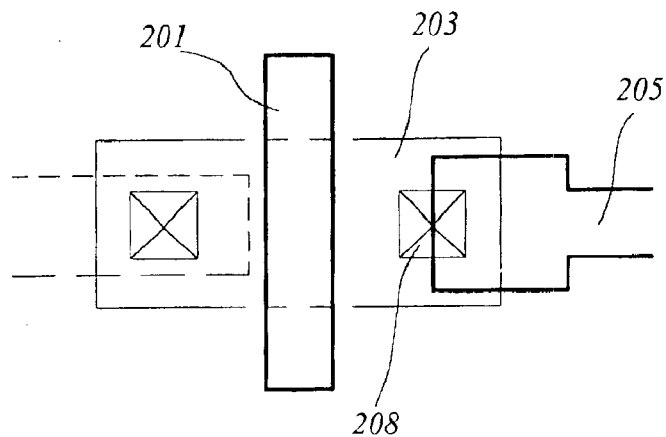
FIG. 2(e) cross section after contact etch
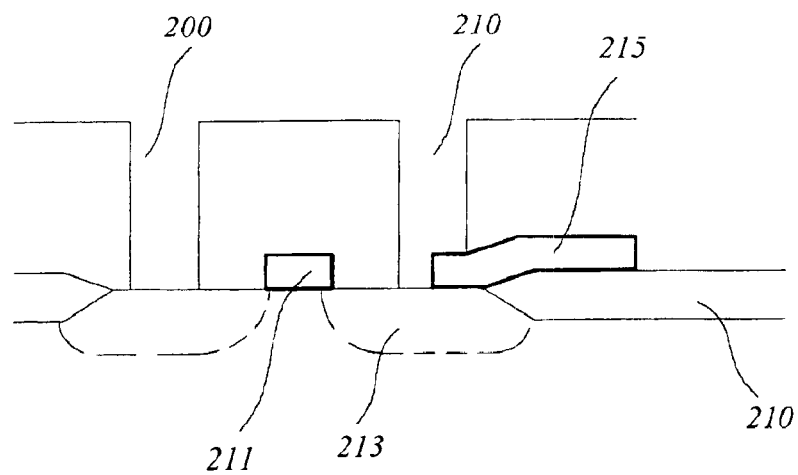
FIG. 2(f) cross section after metal 1
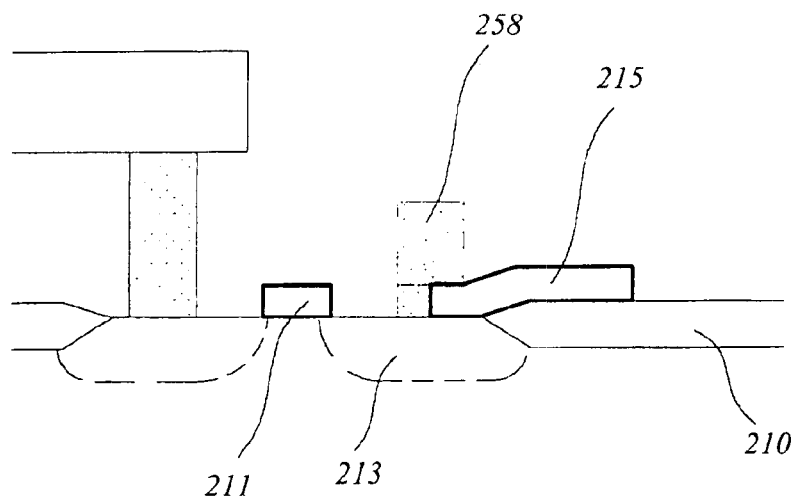

FIG. 3(a) rectangle contact
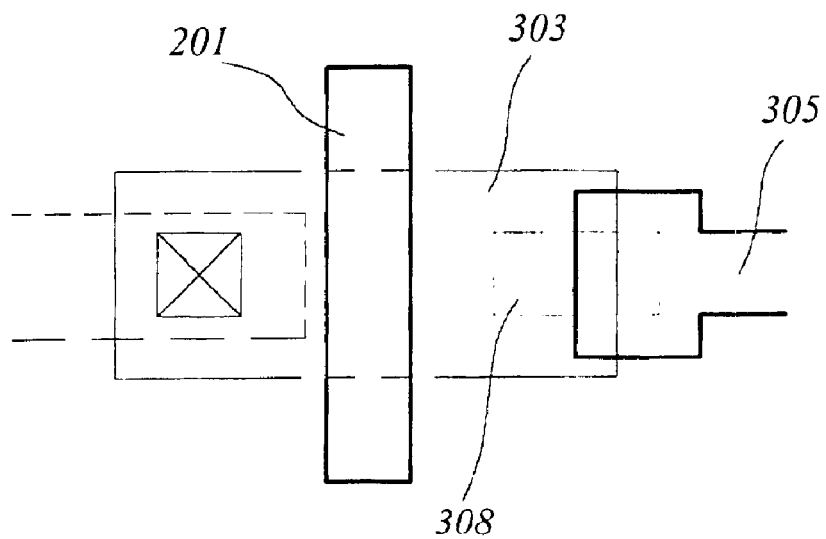
FIG. 3(b) cross section for rectangle contact
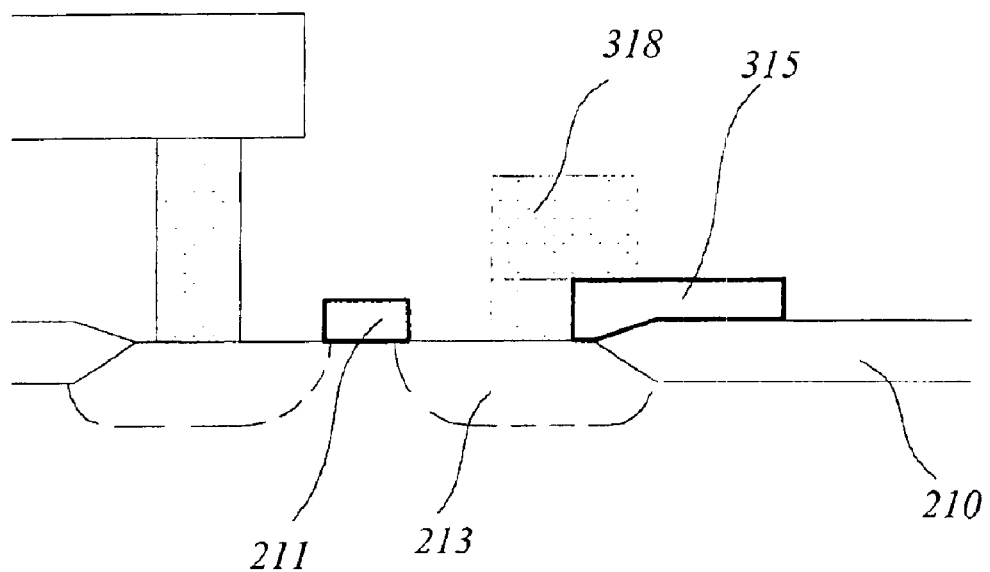

METHODS AND CONFIGURATION TO SIMPLIFY CONNECTIONS BETWEEN POLYSILICON LAYER AND DIFFUSION AREA

This application claims priority to a pending U.S. provisional patent application entitled METHODS AND CONFIGURATION TO SIMPLIFY CONNECTIONS BETWEEN POLYSILICON LAYER AND DIFFUSION AREA, filed Oct. 23, 2002 by Jeng-Jye Shau as the sole inventor of this Application and accorded a Ser. No. 60/420,884, the benefit of its filing date being hereby claimed under Title 35 of the United States Code.

BACKGROUND OF THE INVENTION

1. Field of the Invention

The present invention relates to integrated circuit (IC) manufacture procedures, and more particularly to methods for connecting poly-crystal silicon (poly) layer and diffusion area.

2. Descriptions of Related Arts

FIG. 1(a) shows the top view for an example of current art poly-to-diffusion connection (PDC). A diffusion contact (108) is placed on top of diffusion area (103). A poly contact (109) is placed on top of poly (105) area. These two contacts (108, 109) connected by a metal layer (107). The cross section view of the structure in FIG. 1(a) is shown in FIG. 1(b). The poly layer (115) on field oxide (110) is connected to the diffusion area (113) through a poly contact (119), a metal layer (117), and a diffusion contact (118).

The dimension of such PDC is limited by many design rules. There is a design rule limiting the poly-to-diffusion distance (Dd-p), a design rule limiting the poly contact to diffusion distance (Dd-c), and a design rule limiting the contact to contact (Dc-c) distance as shown in FIG. 1(a). In the conventional techniques of integrated circuit designs, these design rules are originally required for the purpose of preventing accidental shorts between the poly and the diffusion areas. However, these design rules are still imposed and employed for designing IC circuits even under the circumstances that the circuit design is intended to connect the poly and diffusion areas. In the conventional techniques of IC design, these rules are still used even that those design rules are not meaningful as exemplified by a circuit as that shown in FIGS. 1(a) and 1(b). In order to meet those design rules that are required for other purposes, current art PDC is highly inefficient. For many integrated circuits, especially for tightly pitched layout circuits, such limitations caused increase in overall layout area. It is therefore desirable to develop an efficient PDC structure to remove those constraints.

SUMMARY OF THE INVENTION

The primary objective of this invention is, therefore, to reduce the areas of poly-to-diffusion connections. The other primary objective of this invention is to reduce the resistance of PDC. Another objective is to achieve said simplification without changing current art IC manufacture procedures.

These and other objects are accomplished by novel structure that using a single contact to form PDC.

While the novel features of the invention are set forth with particularly in the appended claims, the invention, both as to organization and content, will be better understood and appreciated, along with other objects and features thereof, from the following detailed description taken in conjunction with the drawing.

BRIEF DESCRIPTION OF THE DRAWINGS

FIG. 2(a) is the top view for a PDC of the present invention;

FIG. 2(b) shows the cross-section structures of the PDC in FIG. 2(a) after contact etching procedure;

FIG. 2(c) shows the final cross-section structures of the PDC in FIG. 2(a);

FIG. 2(d) is the top view for a PDC of the present invention that does not use metal layer;

FIG. 2(e) shows the cross-section structures of the PDC in FIG. 2(d) after contact etching procedure;

FIG. 2(f) shows the final cross-section structures of the PDC in FIG. 2(d);

FIG. 3(a) is the top view for a PDC of the present invention that has a rectangular contact; and FIG. 3(b) shows the cross-section structures of the PDC in FIG. 3(a).

DETAILED DESCRIPTION OF THE INVENTION

Figure 1A:
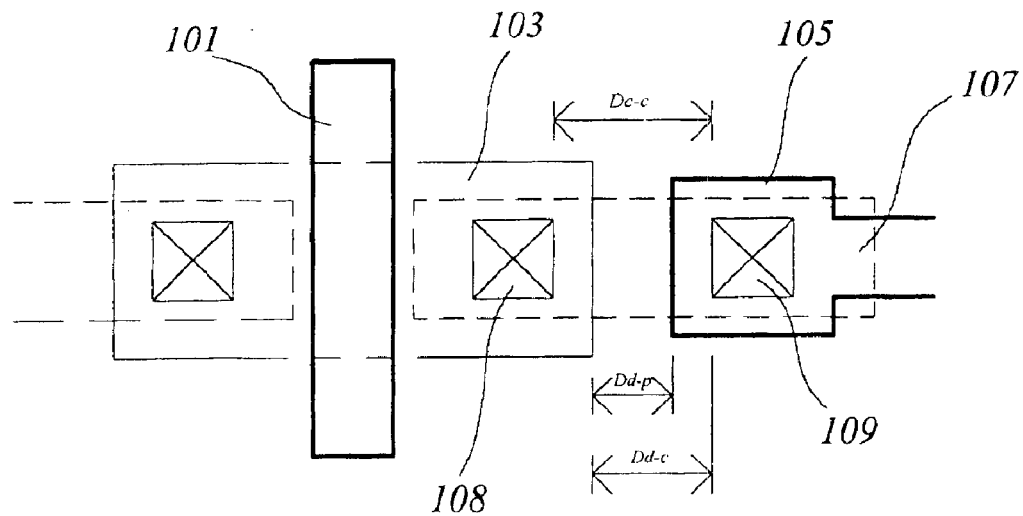
FIG. 1(a) is the top view of a prior art PDC.
Figure 1B:
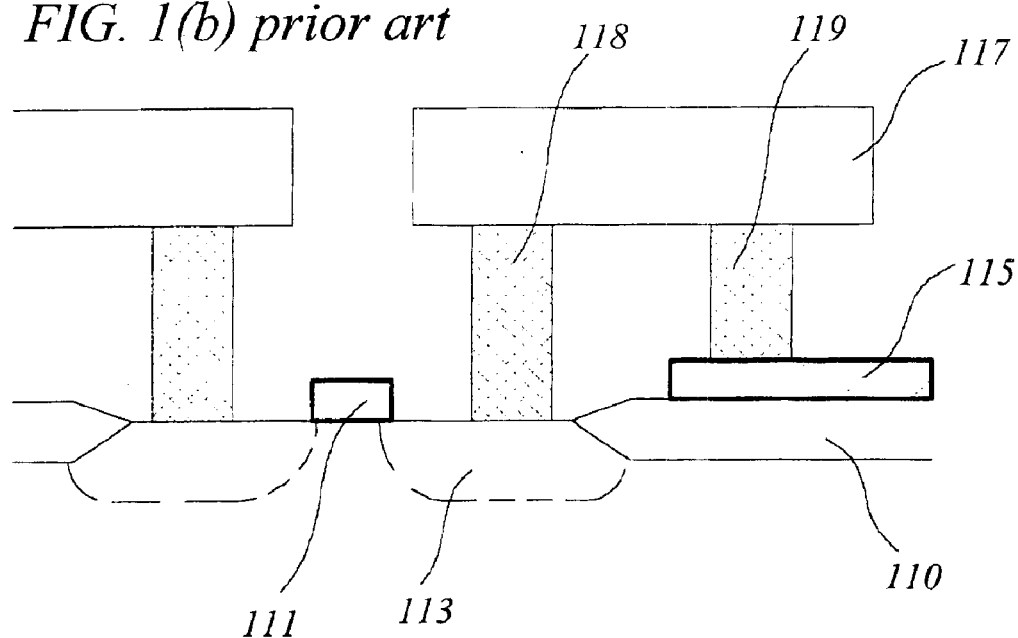
FIG. 1(b) shows the cross-section structures of the prior art PDC in FIG. 1(a)

FIG. 2(a) shows the top view for one example of a PDC of the present invention. In this example, the poly area (205) is extended into the depletion area (203). A contact (208) is placed covering both the poly (205) and depletion (203) areas. The connection is therefore formed by a single contact (208). FIG. 2(b) shows the cross section structures of the PDC in FIG. 2(a) after contact etching procedures have been done. A contact opening (210) is opened covering both the poly area (215) and the diffusion area (213). The contact etching procedure will remove the insulating layers while stopping on silicon. Since both the poly and the diffusion areas are made of silicon, both areas will be exposed after the contact etching procedures as shown in FIG. 2(b). The following contact forming procedures will fill the contact opening (210) in FIG. 2(b) and form a direct connection between diffusion and poly as shown in the cross section diagram in FIG. 2(c).

The PDC of the present invention uses only one contact. Its area is therefore much smaller than prior art PDC in FIG. 1(a). No changes in IC manufacture procedures are needed to support the structure in FIG. 2(a). Therefore, there is no additional cost to support such connection structures.

While specific embodiments of the invention have been illustrated and described herein, it is realized that other modifications and changes will occur to those skilled in the art. For example, different contact filling materials can be used to assure better connections. Different contact etching procedures also can have similar effects. In the above example, the shared contact (208, 218) is connected to metal layer (207, 217) so that other structures also can be connected to this PDC using metal connections. When there is no need to connect this PDC to other structures, there would be no need for such metal connection. FIG. 2(d) shows the top view of a PDC of the present invention that uses a contact without metal connection. FIG. 2(e) and FIG. 2(f) are cross section views of the structures in FIG. 2(d). Such PDC that does not use metal layer further optimize the area efficiency of PDC.

One potential problem for the above PDC structure is the possibility for the contact to miss diffusion or poly layer due to misalignment of the contact. A simple solution is to elongate the contact area as shown in FIG. 3(a). In this example, the contact (308) is elongated vertical to the poly/diffusion edge to assure sufficient connections. The cross section view of such contact (318) is shown in FIG. 3(b).

The above examples assume that the PDC contacts of the present invention are formed in the same time as other metal contacts for cost-saving reasons. It is certainly an option to use separated contact etching procedures specifically to form PDC contacts of the present invention. Using separated contact forming procedures will increase manufacture costs, but in will allow other options. One example is to use poly silicon as the contact filling materials (218, 258, 318). It is also possible to further optimize the area of PDC contacts using separated manufacture procedures.

The present invention provides novel contact structures to achieve significant area reduction for PDC. While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

What is claimed is:

1. An electronic device supported on a semiconductor substrate comprising:
   a diffusion area in said substrate and a polysilicon area comprising a polysilicon layer extending over said substrate for contacting said diffusion area;
   a single contact disposed on top of said substrate contacting both said polysilicon layer and said diffusion area; and
   a field oxide disposed next to said diffusion area wherein said polysilicon layer disposed on top of said field oxide and extending therefrom to contact said diffusion area.

2. The electronic device of claim 1 further comprising:
   a metal layer disposed on top of said single contact for connecting to another circuit element of said electronic device.

3. The electronic device of claim 1 further comprising:
   said electronic device further comprising a transistor and said diffusion area further comprising a source/drain of said transistor.

4. An electronic device supported on a semiconductor substrate comprising:
   a diffusion area in said substrate and a polysilicon area comprising a polysilicon layer extending over said substrate for contacting said diffusion area;
   a single contact on top of said substrate contacting both said polysilicon layer and said diffusion area; and
   said single contact further comprising a conductive material filling a contact opening etched in an insulating layer overlying said diffusion area and said polysilicon area.

5. A poly-to diffusion connection (PDC) disposed on a substrate comprising:
   a diffusion area in said substrate and a polysilicon area comprising a polysilicon layer extending over said substrate for contacting said diffusion area;
   a single contact disposed on top of said substrate contacting both said polysilicon layer and said diffusion area; and
   a field oxide disposed on said substrate next to said diffusion area wherein said polysilicon layer disposed on top of said field oxide and extending therefrom to contact said diffusion area.

6. A poly-to diffusion connection (PDC) disposed on a substrate comprising:
   a diffusion area in said substrate and a polysilicon area comprising a polysilicon layer extending over said substrate for contacting said diffusion area;
   a single contact comprising a conductive material filling a contact opening etched in an insulating layer overlying said diffusion area and said polysilicon area.

7. The PDC of claim 6 further comprising:
   a metal layer disposed on top of said single contact for connecting to another circuit element disposed on said substrate.

8. A method for configuring an electronic device on a semiconductor substrate comprising:
   forming a diffusion area in said substrate:
   configuring a polysilicon area by forming a polysilicon laye; extending over said substrate for contacting said diffusion area; and
   forming a field oxide next to said diffusion area and forming said polysilicon layer on top of said field oxide and extending therefrom to contact said diffusion area.

9. The method of claim 11 further comprising:
   forming a metal layer on top of said single contact for connecting to another circuit element of said electronic device.

10. A method for configuring an electronic device on a semiconductor substrate comprising:
    forming a diffusion area in said substrate;
    configuring a polysilicon area by forming a polysilicon layer extending over said substrate for contacting said diffusion area;
    etching a contact opening in an insulating layer that overlying said diffusion area and said polysilicon layer; and
    filling said contact opening with a conductive material.

11. The method of claim 10 wherein:
    said method of configuring said electronic device further comprising a step of forming a transistor by employing said diffusion area as a source/drain of said transistor.

12. A method for forming a poly-to diffusion connection (PDC) on a substrate comprising:
    forming a diffusion area in said substrate and forming a polysilicon area by extending a polysilicon layer from said polysilicon area over said substrate to said diffusion area for contacting said diffusion area; and
    forming a field oxide on said substrate next to said diffusion area and forming said polysilicon layer on top of said field oxide and extending therefrom to contact said diffusion area.

13. The method of claim 12 wherein said step of forming said single contact further comprising:
    etching a contact opening in an insulting layer overlying said diffusion area and said polysilicon area; and
    filling said contact opening with a conductive material.

14. The method of claim 12 further comprising:
    forming a metal layer on top of said single contact for connecting to another circuit element disposed on said substrate.

* * * * *